(12) United States Patent
Ogawa et al.

(10) Patent No.: US 7,667,536 B2
(45) Date of Patent: Feb. 23, 2010

(54) OFFSET FIXING OPERATIONAL AMPLIFIER CIRCUIT

(75) Inventors: Munehiko Ogawa, Osaka (JP); Tomokazu Kojima, Osaka (JP); Hiroshi Kojima, Kyoto (JP)

(73) Assignee: Panasonic Corporation, Osaka (JP)

( * ) Notice: Subject to any disclaimer, the term of this patent is extended or adjusted under 35 U.S.C. 154(b) by 2 days.

(21) Appl. No.: 12/128,177

(22) Filed: May 28, 2008

(65) Prior Publication Data

US 2008/0309410 A1 Dec. 18, 2008

(30) Foreign Application Priority Data

Jun. 14, 2007 (JP) .............................. 2007-157234

(51) Int. Cl.
*H03F 1/02* (2006.01)
(52) U.S. Cl. .......................................... 330/9; 330/261
(58) Field of Classification Search ..................... 330/9, 330/261, 257, 253
See application file for complete search history.

(56) References Cited

U.S. PATENT DOCUMENTS

| | | | | |
|---|---|---|---|---|
| 6,140,872 A | * | 10/2000 | McEldowney | 330/9 |
| 6,380,801 B1 | * | 4/2002 | McCartney | 330/9 |
| 6,825,721 B2 | * | 11/2004 | Sanchez et al. | 330/253 |
| 6,828,856 B2 | * | 12/2004 | Sanchez et al. | 330/253 |

FOREIGN PATENT DOCUMENTS

JP  08-204468  8/1996

* cited by examiner

*Primary Examiner*—Henry K Choe
(74) *Attorney, Agent, or Firm*—McDermott Will & Emery LLP

(57) ABSTRACT

In an offset fixing operational amplifier circuit, an operational amplifier circuit includes an input stage containing a first constant current source, a second constant current source, a first differential pair and a second differential pair. A bias circuit supplies a bias voltage to the operational amplifier circuit. An offset fixing circuit controls the input stage in accordance with an input voltage of the operational amplifier circuit.

9 Claims, 18 Drawing Sheets

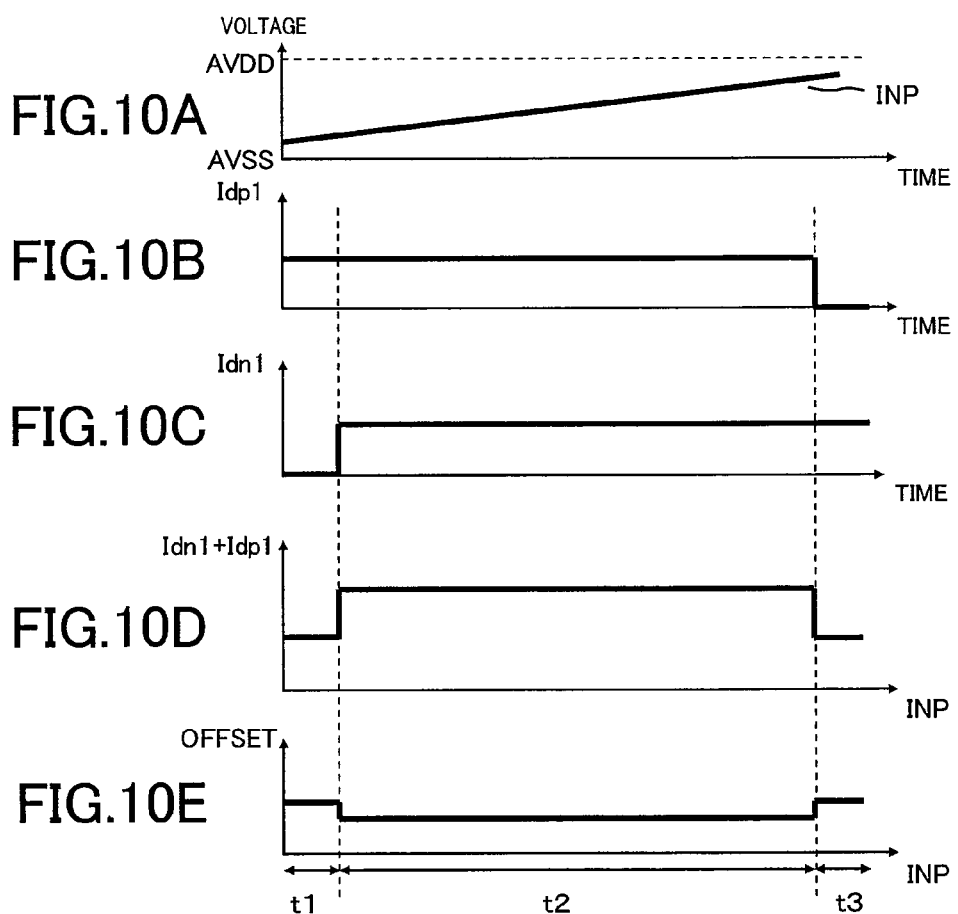

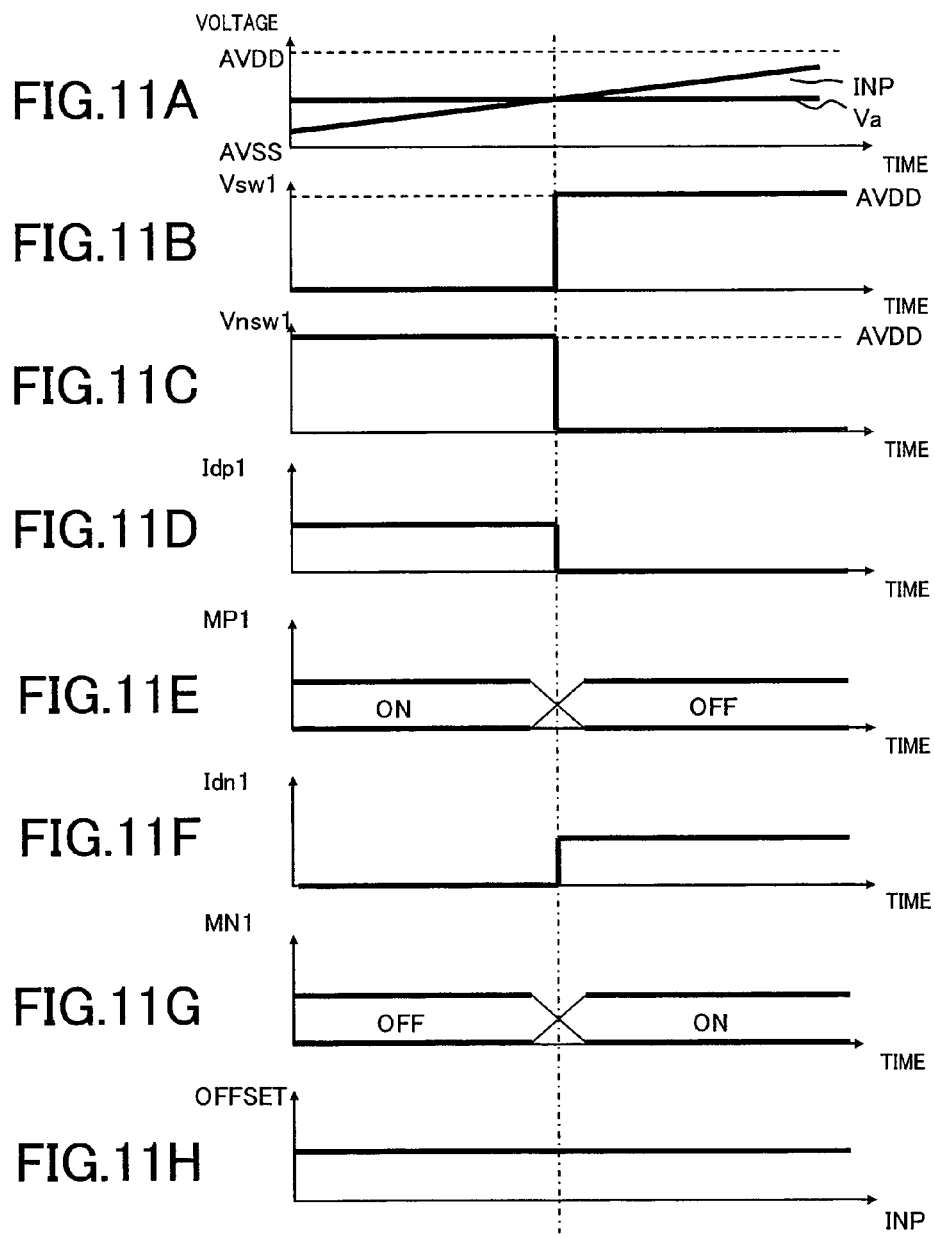

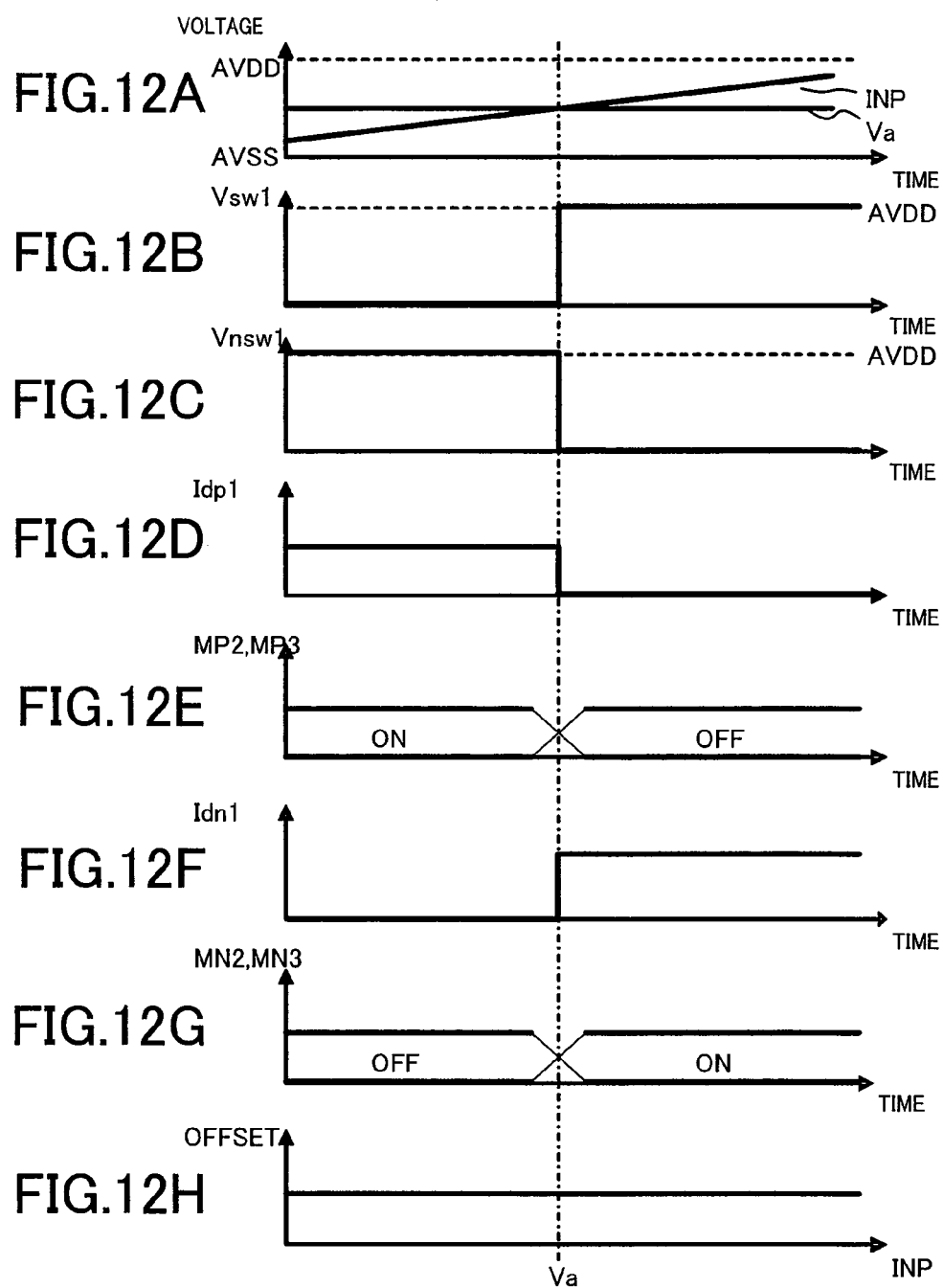

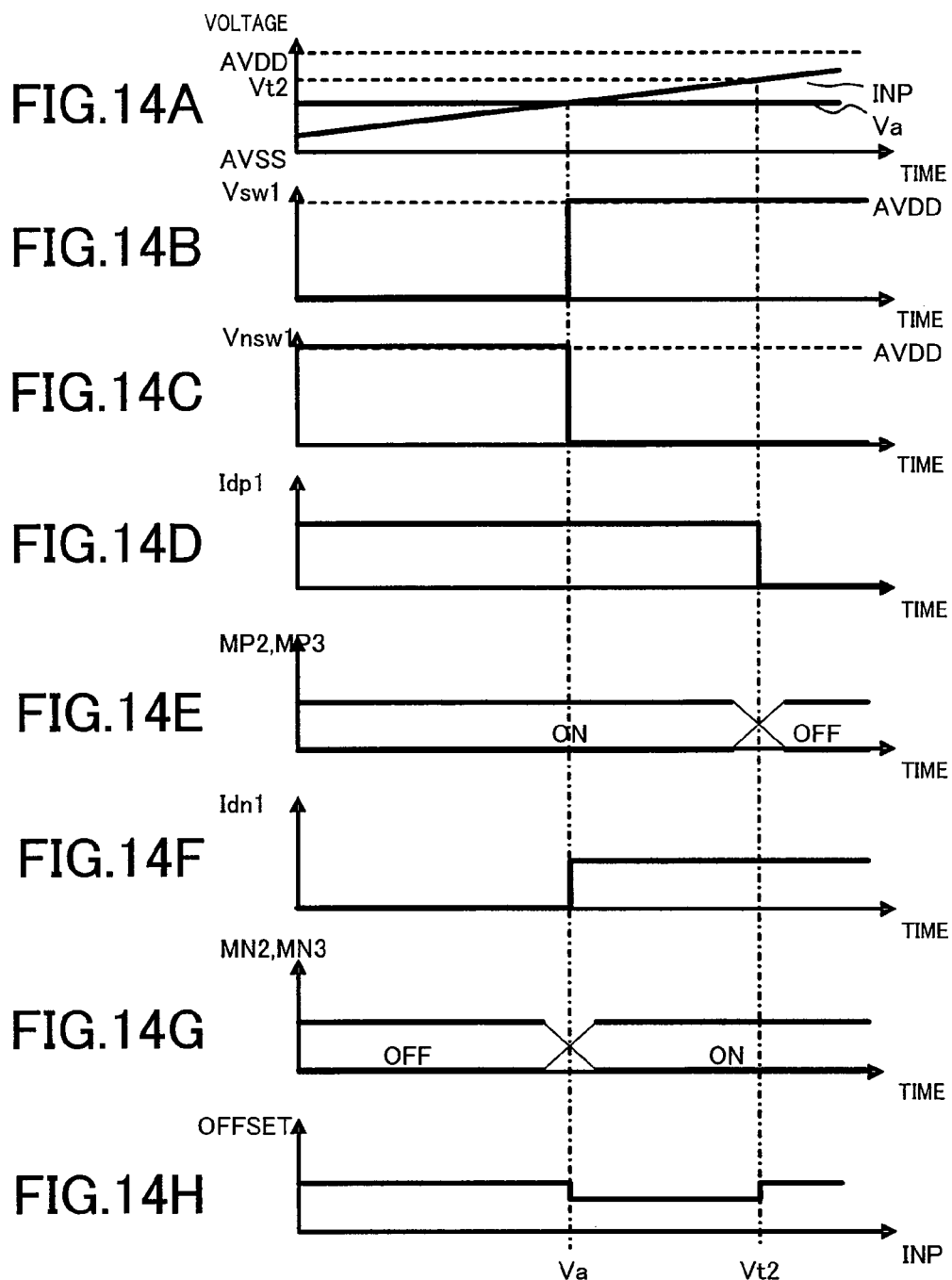

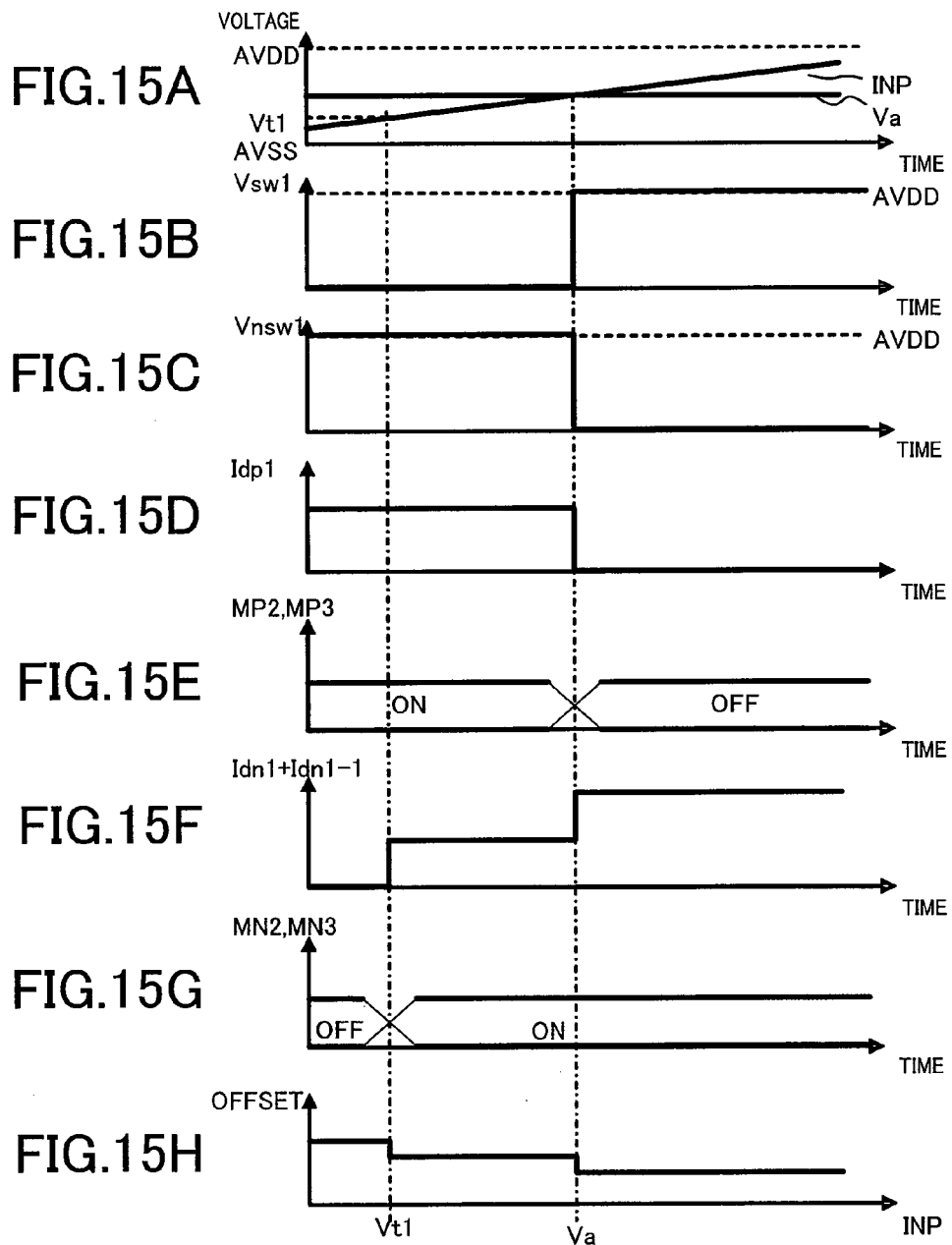

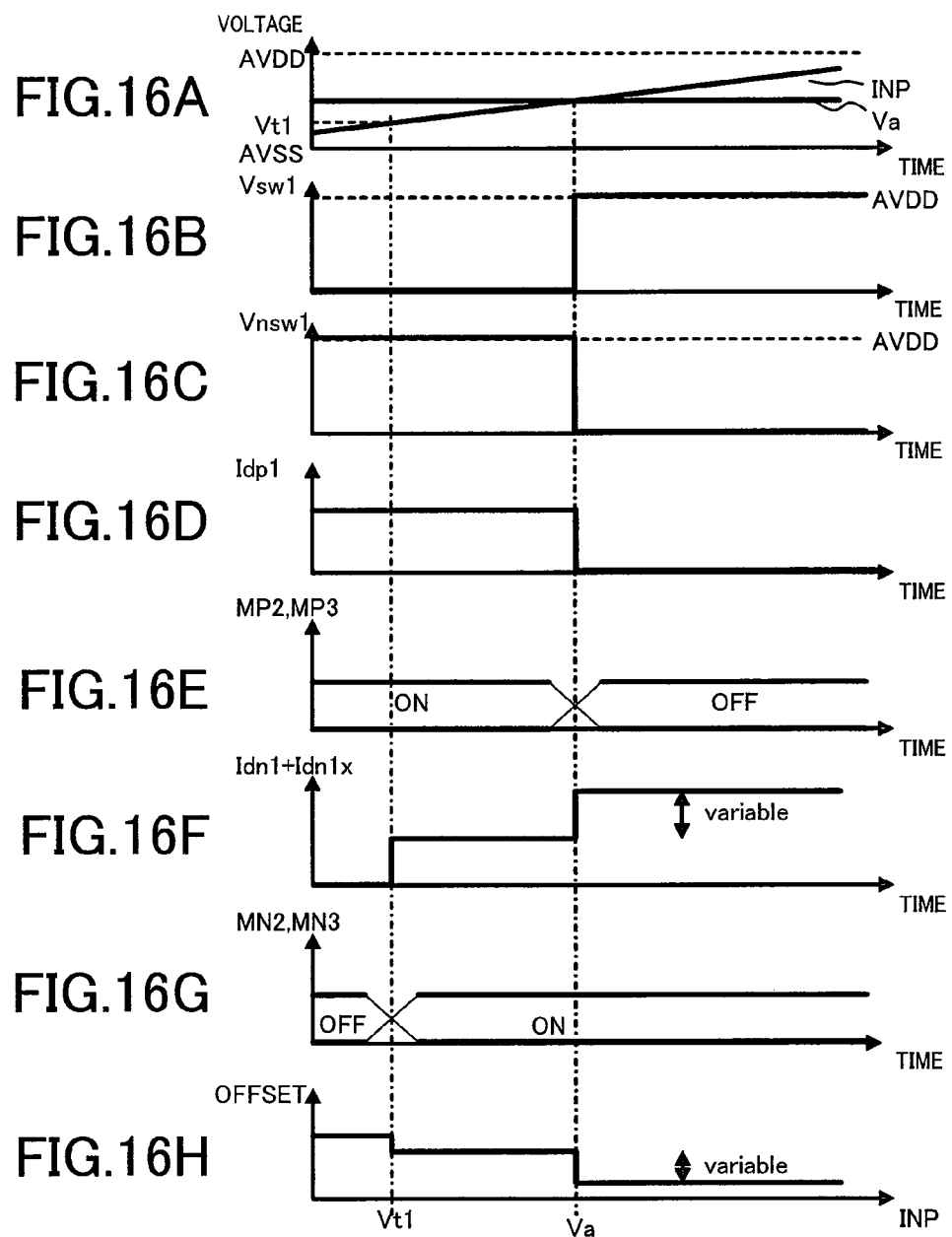

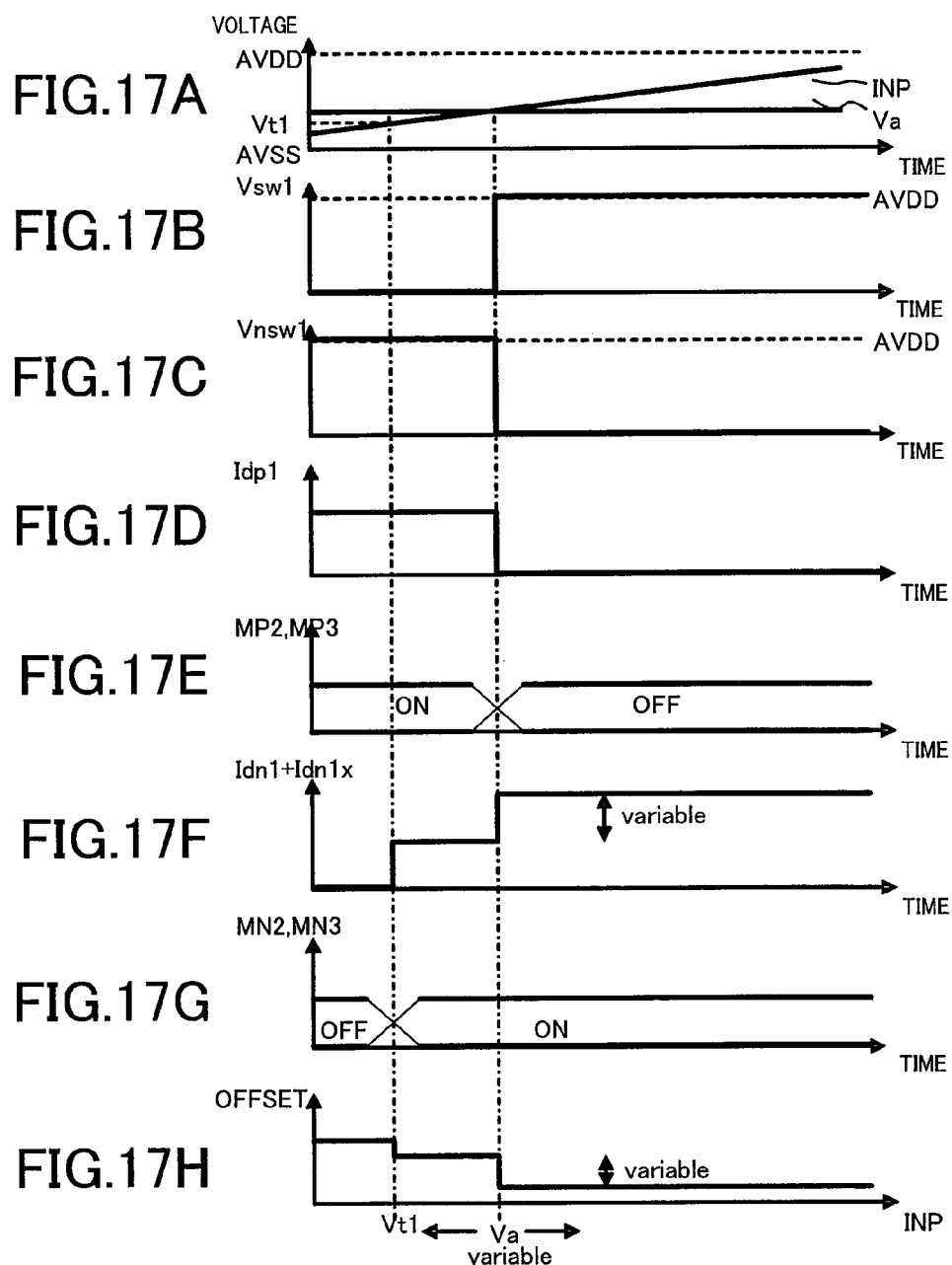

OFFSET FIXING OPERATIONAL AMPLIFIER CIRCUIT

BACKGROUND OF THE INVENTION

The present invention relates to an operational amplifier circuit, and more particularly, it relates to an operational amplifier circuit for fixing an offset voltage to a constant value in an output dynamic range.

Recently, with respect to liquid crystal panels and organic EL panels particularly for use in portable equipment, compact mobile equipment and large panel equipment, there are increasing demands for an operational amplifier circuit capable of outputting a constant offset in a wide output voltage range with small power consumption. In conventional technique, an operational amplifier circuit is generally used for realizing a wide output voltage range, but it has been impossible to fix an offset to a constant value in a wide output range because of restriction in the circuit configuration.

A conventional operational amplifier circuit will now be described with reference to FIG. 18. The operational amplifier circuit roughly includes three parts, that is, an input stage, a phase compensating part and an output stage. The operational amplifier circuit receives bias voltages VBP0, VBP1, VBP2, VBP3, VBP4, VBN0, VBN1, VBN2, VBN3 and VBN4 from a bias circuit for performing a given operation.

Offset specialization of the conventional operational amplifier circuit will now be described with reference to FIGS. 10A through 10E. A waveform of FIG. 10A is obtained when an input voltage INP is changed from a potential resulting from addition of an overdrive voltage to a voltage AVSS to a potential resulting from subtraction of the overdrive voltage from a voltage AVDD. At this point, a current flowing to a transistor MP1, that is, a PMOS current source of the input stage, is indicated by Idp1 and a current flowing to a transistor MN1, that is, an NMOS current source, is indicated by Idn1. A waveform of FIG. 10B shows a current characteristic of the current Idp1 flowing to the PMOS transistor MP1 when the voltage INP is changed from the potential resulting from the addition of the overdrive voltage to the voltage AVSS to the potential resulting from the subtraction of the overdrive voltage from the voltage AVDD. In a period t3, no current flows because PMOS differential pair transistors MP2 and MP3 are in an off state. A waveform of FIG. 10C shows a current characteristic of the current Idn1 flowing to the NMOS transistor MN1 when the voltage INP is changed from the potential resulting from the addition of the overdrive voltage to the voltage AVSS to the potential resulting from the subtraction of the overdrive voltage from the voltage AVDD. In a period t1, no current flows because transistors MN2 and MN3 are in an off state.

A waveform of FIG. 10D shows a current characteristic obtained as a sum of the current characteristics of the currents Idp1 and Idn1 obtained when the voltage INP is changed from the potential resulting from the addition of the overdrive voltage to the voltage AVSS to the potential resulting from the subtraction of the overdrive voltage from the voltage AVDD. In the period t1, since the NMOS current source MN1 is halted, a current value obtained as a sum of the currents Idp1 and Idn1 is equal to the current value of the current Idp1. In a period t2, since both the NMOS current source MN1 and the PMOS current source MP1 are operated, a current value obtained in this period is equal to a current value obtained as the sum of the currents Idp1 and Idn1. In the period t3, since the PMOS current source MP1 is halted, a current value obtained as the sum of the currents Idp1 and Idn1 is equal to the current value of the current Idn1.

A waveform of FIG. 10E shows an offset characteristic obtained when the voltage INP is changed from the potential resulting from the addition of the overdrive voltage to the voltage AVSS to the potential resulting from the subtraction of the overdrive voltage from the voltage AVDD. Owing to the characteristic of an ideal operational amplifier, a gain is larger and an offset value is smaller when a current obtained as the sum of the currents Idp1 and Idn1 is larger. On the other hand, when the current is smaller, the gain is smaller and the offset value is larger. Specifically, based on the current characteristic obtained as the sum of the currents Idp1 and Idn1 shown in FIG. 10D, the offset value is larger in the periods t1 and t3 and is smaller in the period t2. In other words, since the gain of the input stage is varied in accordance with the input voltage value, the offset value is also varied in accordance with the input voltage value, and thus, a constant offset cannot be realized.

SUMMARY OF THE INVENTION

In consideration of the aforementioned conventional problem, an object of the invention is realizing a constant offset in a wide output voltage range in an operational amplifier circuit. For achieving this object, the invention is practiced as follows:

The offset fixing operational amplifier circuit of this invention includes an operational amplifier circuit having an input stage containing a first constant current source, a second constant current source, a first differential pair and a second differential pair; a bias circuit for supplying a bias voltage to the operational amplifier circuit; and an offset fixing circuit for controlling the input stage in accordance with an input voltage of the operational amplifier circuit.

Since the offset fixing circuit is thus additionally provided in a conventional operational amplifier circuit, currents of a PMOS differential current source and an NMOS differential current source are controlled in accordance with the input voltage. As a result, remarkable effects to reduce power consumption and to fix the offset are attained.

BRIEF DESCRIPTION OF THE DRAWINGS

FIGS. 10A, 10B, 10C, 10D and 10E show a timing chart of a conventional operational amplifier circuit.

FIGS. 11A, 11B, 11C, 11D, 11E, 11F, 11G and 11H show a timing chart of the offset fixing operational amplifier circuit of Embodiment 1 of the invention.

FIGS. 12A, 12B, 12C, 12D, 12E, 12F, 12G and 12H show a timing chart of the offset fixing operational amplifier circuit of Embodiment 2 of the invention.

FIGS. 14A, 14B, 14C, 14D, 14E, 14F, 14G and 14H show a timing chart of the offset fixing operational amplifier circuit of Embodiment 4 of the invention.

FIGS. 15A, 15B, 15C, 15D, 15E, 15F, 15G and 15H show a timing chart of the offset fixing operational amplifier circuit of Embodiment 5 of the invention.

FIGS. 16A, 16B, 16C, 16D, 16E, 16F, 16G and 16H show a timing chart of the offset fixing operational amplifier circuit of Embodiment 6 of the invention.

FIGS. 17A, 17B, 17C, 17D, 17E, 17F, 17G and 17H show a timing chart of the offset fixing operational amplifier circuit of Embodiment 7 of the invention.

DETAILED DESCRIPTION OF THE INVENTION

Embodiment 1

Figure 1:
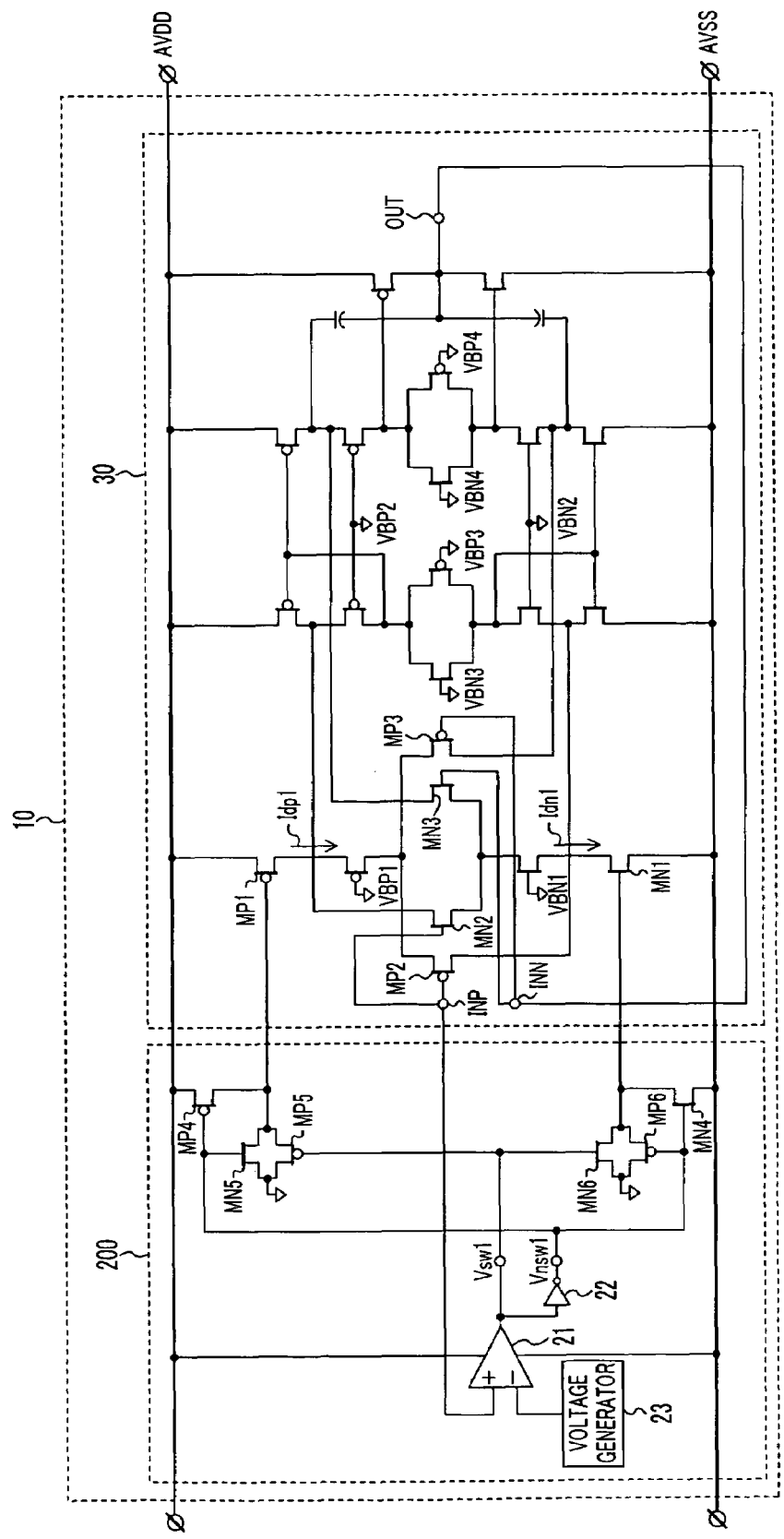
FIG. 1 is a circuit diagram of an offset fixing operational amplifier circuit according to Embodiment 1 of the invention.

FIG. 1 is a circuit diagram of an offset fixing operational amplifier circuit according to Embodiment 1 of the invention. The offset fixing operational amplifier circuit 10 of this embodiment includes an offset fixing circuit 200 and a conventional operational amplifier circuit 30.

The offset fixing circuit 200 includes a voltage comparator circuit 21 for comparing an output voltage value of a voltage generator 23 and an input voltage INP of the operational amplifier circuit 30; an inverter 22 for generating an inverted signal Vnsw1 of an output signal Vsw1 of the voltage comparator circuit 21; a PMOS switch MP4 for switching supply of a voltage AVDD to a gate of a PMOS differential transistor with the inverted signal Vnsw1 used as a control signal; switches MN5 and MP5 for switching supply of a bias voltage to the gate of the PMOS differential transistor with the signals Vsw1 and Vnsw1 used as control signals; an NMOS switch MN4 for switching supply of a voltage AVSS to a gate of an NMOS differential transistor with the signal Vnsw1 used as a control signal; and switches MN6 and MP6 for switching supply of a bias voltage to the gate of the NMOS differential transistor with the signals Vsw1 and Vnsw1 used as control signals.

The offset fixing operational amplifier circuit 10 has a function to switch on/off states of the PMOS differential current source and the NMOS differential current source on the basis of a comparison result of the output voltage of the voltage generator 23 and the input voltage INP of the operational amplifier circuit 30. Now, the operation of the offset fixing operational amplifier circuit 10 will be described with reference to FIGS. 11A through 11H. It is assumed in the description below that the voltage generator 23 output an output voltage Va. Also, it is assumed that the voltage comparator circuit 21 outputs the voltage AVDD when the input voltage INP is larger than the output voltage Va and outputs the voltage AVSS when the input voltage INP is smaller than the output voltage Va.

A waveform of FIG. 11A is obtained when the input voltage INP of the operational amplifier circuit 30 is changed from a potential resulting from addition of an overdrive voltage to the voltage AVSS to a potential resulting from subtraction of the overdrive voltage from the voltage AVDD. In a period when the input voltage INP is smaller than the output voltage Va, the signal Vsw1 corresponds to the voltage AVSS, and in a period when the input voltage INP is larger than the output voltage Va, the signal Vsw1 corresponds to the voltage AVDD (see FIG. 11B). In the period when the input voltage INP is smaller than the output voltage Va, the signal Vnsw1 corresponds to the voltage AVDD, and in the period when the input voltage INP is larger than the output voltage Va, the signal Vnsw1 corresponds to the voltage AVSS (see FIG. 11C). In the period when the input voltage INP is smaller than the output voltage Va, the transistor MP1 is in an on state and hence a constant current flows as a current Idp1, and in the period when the input voltage INP is larger than the output voltage Va, the transistor MP1 is in an off state and hence the current Idp1 does not flow (see FIGS. 11D and 11E). In the period when the input voltage INP is smaller than the output voltage Va, the transistor MN1 is in an off state and hence a current Idn1 does not flow, and in the period when the input voltage INP is larger than the output voltage Va, the transistor MN1 is in an on state and hence a constant current flows as the current Idn1 (see FIGS. 11F and 11G). As a result, in the offset fixing operational amplifier circuit 10 of this embodiment, merely one of the PMOS constant current source and the NMOS constant current source is turned on based on a point where the input voltage INP is equal to the output voltage Va, and therefore, a constant offset characteristic is attained in a wide voltage range (see FIG. 11H).

Embodiment 2

Figure 2:
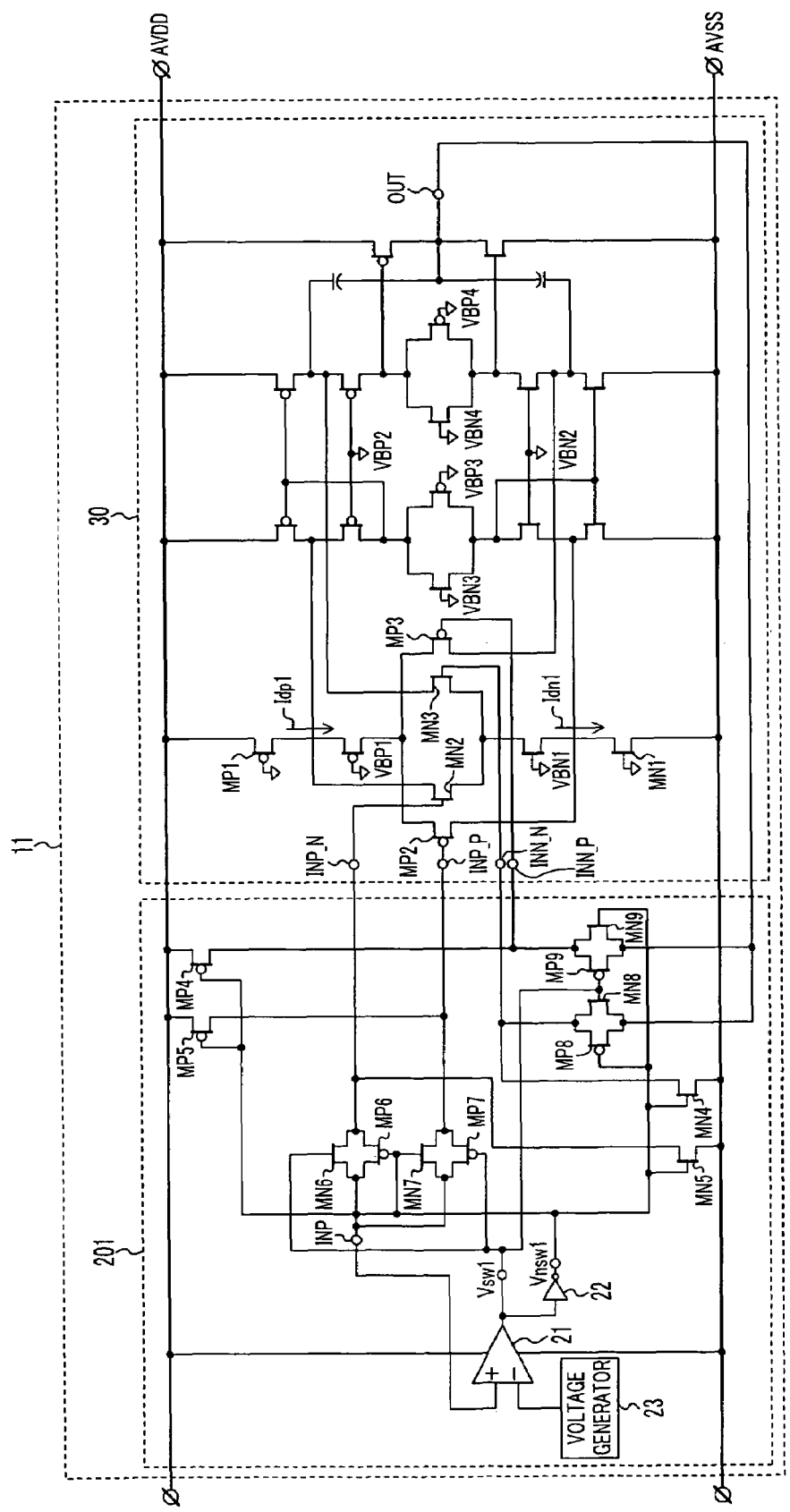
FIG. 2 is a circuit diagram of an offset fixing operational amplifier circuit according to Embodiment 2 of the invention.

FIG. 2 is a circuit diagram of an offset fixing operational amplifier circuit according to Embodiment 2 of the invention. The offset fixing operational amplifier circuit 11 of this embodiment includes an offset fixing circuit 201 and a conventional operational amplifier circuit 30. A significant difference between the offset fixing operational amplifier circuit 11 of this embodiment and the offset fixing operational amplifier circuit 10 of FIG. 1 is that an offset is kept constant by controlling gate voltages of differential pair transistors in this embodiment.

The offset fixing circuit 201 includes a voltage comparator circuit 21 for comparing an output voltage value of a voltage generator 23 and an input voltage INP of the operational amplifier circuit 30; an inverter 22 for generating an inverted signal Vnsw1 of an output signal Vsw1 of the voltage comparator circuit 21; a PMOS switch MP5 for switching supply of a voltage AVDD for a gate voltage INP_P of a transistor of a PMOS differential pair with the inverted signal Vnsw1 used as a control signal; switches MN7 and MP7 for switching supply of the input voltage INP for the gate voltage INP_P of the transistor of the PMOS differential pair with the signals Vsw1 and Vnsw1 used as control signals; an NMOS switch MN5 for switching supply of a voltage AVSS for a gate voltage INP_N of a transistor of an NMOS differential pair; switches MN6 and MP6 for switching supply of the input voltage INP for the gate voltage INP_N of the transistor of the NMOS differential pair with the signals Vsw1 and Vnsw1 used as control signals; a PMOS switch MP4 for switching supply of the voltage AVDD for a gate voltage INN_P of a transistor of the PMOS differential pair; switches MN9 and MP9 for controlling supply of an output OUT of the operational amplifier circuit 30 for the gate voltage INN_P of the transistor of the PMOS differential pair with the signals Vsw1 and Vnsw1 used as control signals; an NMOS switch MN4 for switching supply of the voltage AVSS for a gate voltage INN_N of a transistor of the NMOS differential pair; and switches MN8 and MP8 for switching supply of the output OUT for the gate voltage INN_N of the transistor of the NMOS differential pair with the signals Vsw1 and Vnsw1 used as control signals.

Now, the operation of the offset fixing operational amplifier circuit 11 will be described with reference to FIGS. 12A through 12H. It is assumed in the description below that the voltage generator 23 output an output voltage Va. Also, it is assumed that the voltage comparator circuit 21 outputs the voltage AVDD when the input voltage INP is larger than the output voltage Va and outputs the voltage AVSS when the input voltage INP is smaller than the output voltage Va.

A waveform of FIG. 12A is obtained when the input voltage INP of the operational amplifier circuit 30 is changed from a potential resulting from addition of an overdrive voltage to the voltage AVSS to a potential resulting from subtraction of the overdrive voltage from the voltage AVDD. In a period when the input voltage INP is smaller than the output voltage Va, the signal Vsw1 corresponds to the voltage AVSS, and in a period when the input voltage INP is larger than the output voltage Va, the signal Vsw1 corresponds to the voltage AVDD (see FIG. 12B). In the period when the input voltage INP is smaller than the output voltage Va, the signal Vnsw1 corresponds to the voltage AVDD, and in the period when the input voltage INP is larger than the output voltage Va, the signal Vnsw1 corresponds to the voltage AVSS (see FIG. 12C). In the period when the input voltage INP is smaller than the output voltage Va, the differential pair transistors MP2 and MP3 are in an on state and hence a constant current Idp1 passes through the differential pair, and in the period when the input voltage INP is larger than the output voltage Va, the differential pair transistors MP2 and MP3 are in an off state and hence the current Idp1 does not pass through the differential pair (see FIGS. 12D and 12E). In the period when the input voltage INP is smaller than the output voltage Va, the differential pair transistors MN2 and MN3 are in an off state and hence a current Idn1 does not pass through the differential pair, and in the period when the input voltage INP is larger than the output voltage Va, the differential pair transistors MN2 and MN3 are in an on state and hence the current Idn1 passes through the differential pair (see FIGS. 12F and 12G). As a result, in the offset fixing operational amplifier circuit 11 of this embodiment, merely one of the PMOS differential pair and the NMOS differential pair is turned on based on a point where the input voltage INP is equal to the output voltage Va, and therefore, a constant offset characteristic is attained in a wide voltage range (see FIG. 12H).

Embodiment 3

Figure 3:
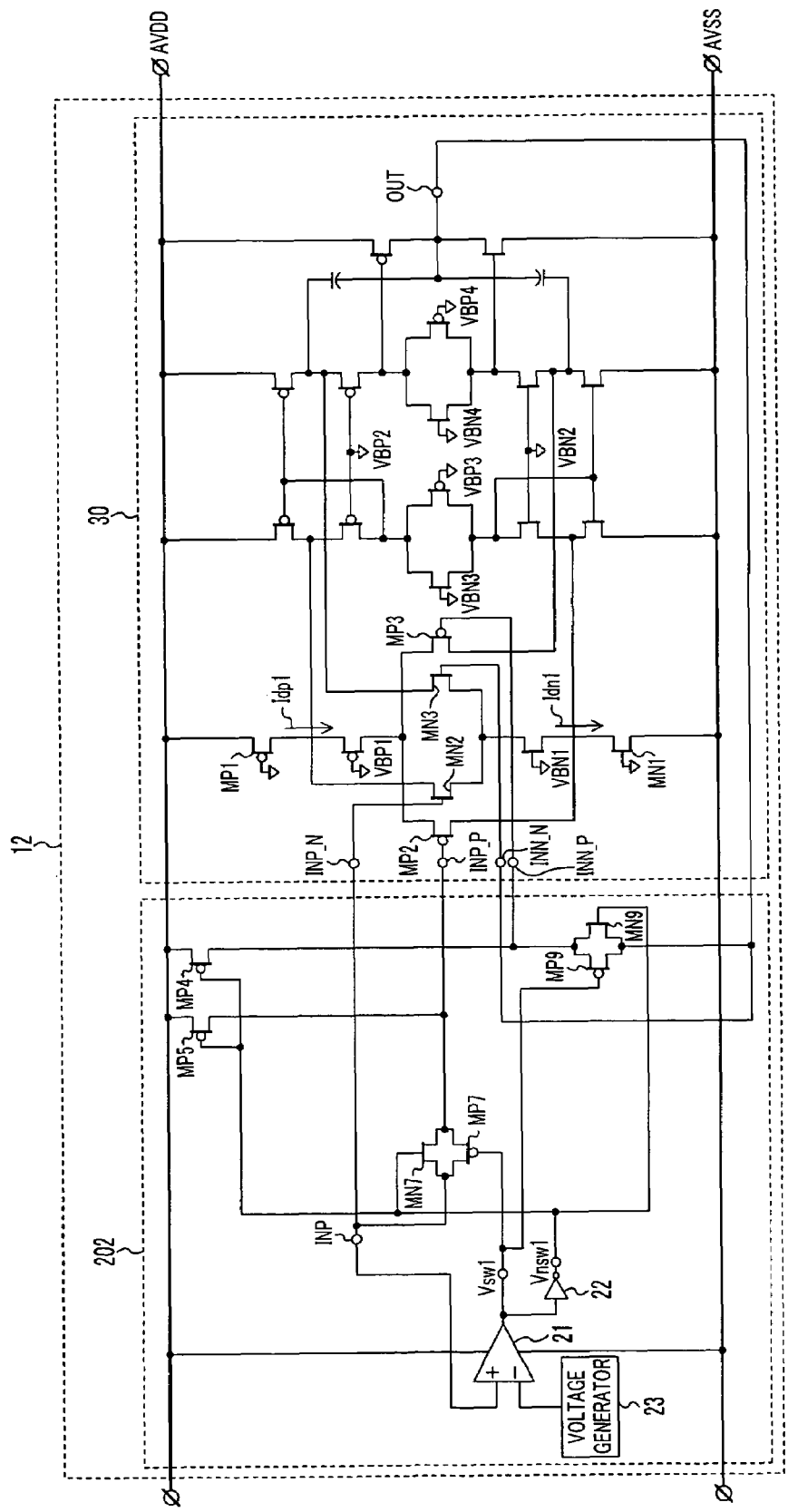
FIG. 3 is a circuit diagram of an offset fixing operational amplifier circuit according to Embodiment 3 of the invention.

FIG. 3 is a circuit diagram of an offset fixing operational amplifier circuit according to Embodiment 3 of the invention. The offset fixing operational amplifier circuit 12 of this embodiment includes an offset fixing circuit 202 and a conventional operational amplifier circuit 30. A significant difference between the offset fixing operational amplifier circuit 12 of this embodiment and the offset fixing operational amplifier circuit 11 of FIG. 2 is that an offset value is changed in accordance with an output voltage Va of a voltage generator 23 by controlling a gate voltage of a PMOS differential pair alone in this embodiment.

In the offset fixing circuit 202, all the switches used for controlling the gate voltage INP_N in the offset fixing circuit 201 of FIG. 2 are eliminated and the gate voltage INP_N is connected to the input voltage INP. Also, all the switches used for controlling the gate voltage INN_N are eliminated and the gate voltage INN_N is connected to the output OUT.

Now, the operation of the offset fixing operational amplifier circuit 12 will be described with reference to FIGS. 13A through 13H. It is assumed in the description below that the voltage generator 23 output an output voltage Va. Also, it is assumed that the voltage comparator circuit 21 outputs a voltage AVDD when the input voltage INP is larger than the output voltage Va and outputs a voltage AVSS when the input voltage INP is smaller than the output voltage Va.

Figure 13A:
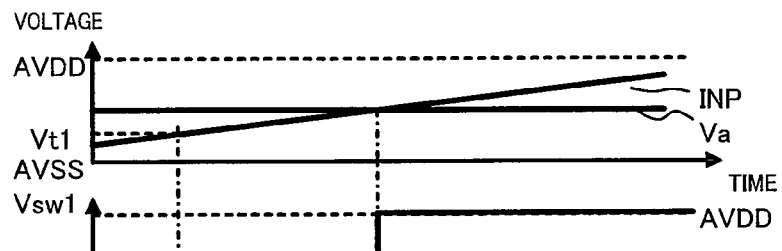
FIGS. 13A, 13B, 13C, 13D, 13E, 13F, 13G and 13H show a timing chart of the offset fixing operational amplifier circuit of Embodiment 3 of the invention.
Figure 13B:
Figure 13C:
Figure 13D:
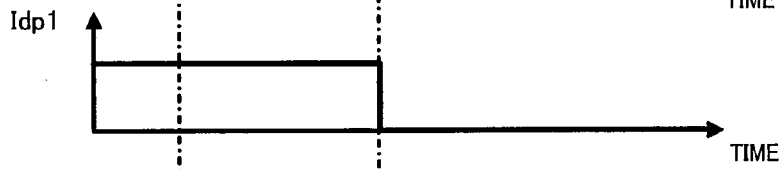
Figure 13E:
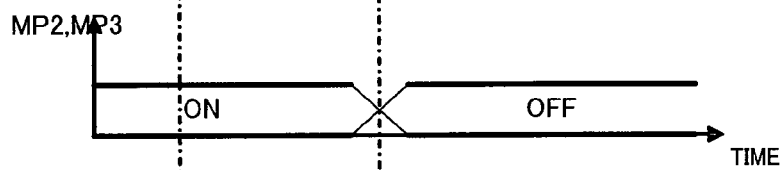
Figure 13F:
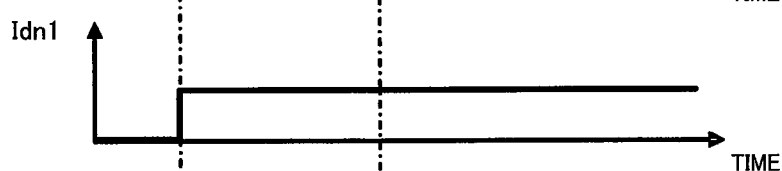
Figure 13G:
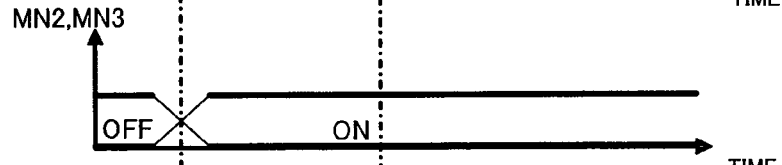
Figure 13H:
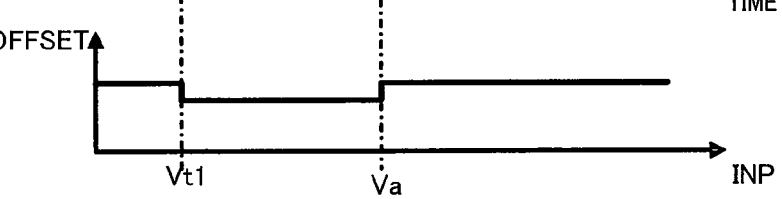
Figure 18:
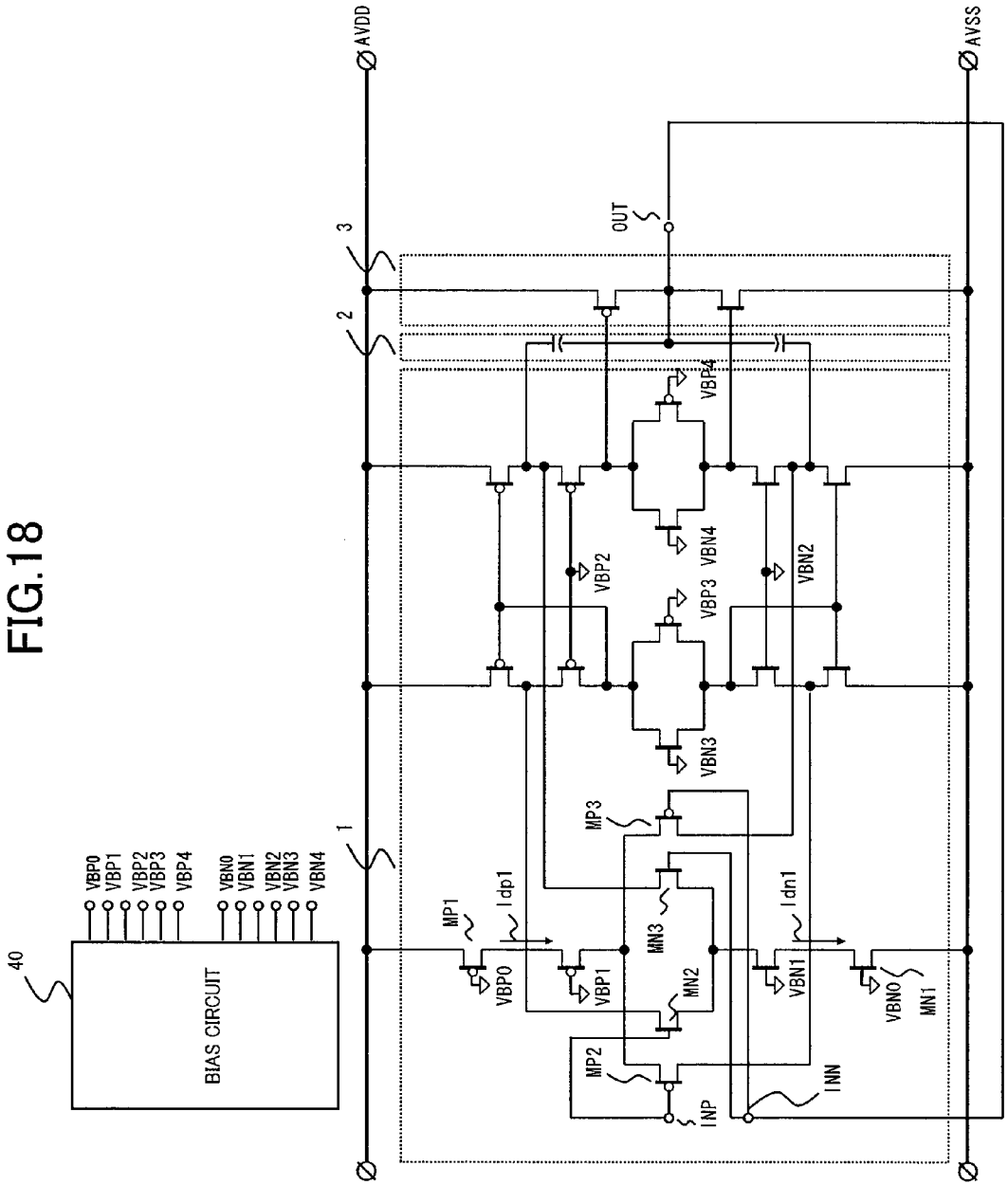
FIG. 18 is a circuit diagram of the conventional operational amplifier circuit.

A waveform of FIG. 13A is obtained when the input voltage INP of the operational amplifier circuit 30 is changed from a potential resulting from addition of an overdrive voltage to the voltage AVSS to a potential resulting from subtraction of the overdrive voltage from the voltage AVDD. In a period when the input voltage INP is smaller than the output voltage Va, a signal Vsw1 corresponds to the voltage AVSS, and in a period when the input voltage INP is larger than the output voltage Va, the signal Vsw1 corresponds to the voltage AVDD (see FIG. 13B). In the period when the input voltage INP is smaller than the output voltage Va, a signal Vnsw1 corresponds to the voltage AVDD, and in the period when the input voltage INP is larger than the output voltage Va, the signal Vnsw1 corresponds to the voltage AVSS (see FIG. 13C). In the period when the input voltage INP is smaller than the output voltage Va, differential pair transistors MP2 and MP3 are in an on state and hence a constant current Idp1 passes through the differential pair, and in the period when the input voltage INP is larger than the output voltage Va, the differential pair transistors MP2 and MP3 are in an off state and hence the current Idp1 does not pass through the differential pair (see FIGS. 13D and 13E). In the period when the input voltage INP is smaller than a voltage Vt1, differential pair transistors MN2 and MN3 are in an off state due to the transistor characteristic and hence a current Idn1 does not pass through the differential pair, and in the period when the input voltage INP is larger than the voltage Vt1, the differential pair transistors MN2 and MN3 are in an on state and hence the current Idn1 passes through the differential pair (see FIGS. 13F and 13G). As a result, in the offset fixing operational amplifier circuit 12 of this embodiment, a constant offset characteristic is attained in the period when the input voltage INP is larger than the output voltage Va (see FIG. 13H).

Embodiment 4

Figure 4:
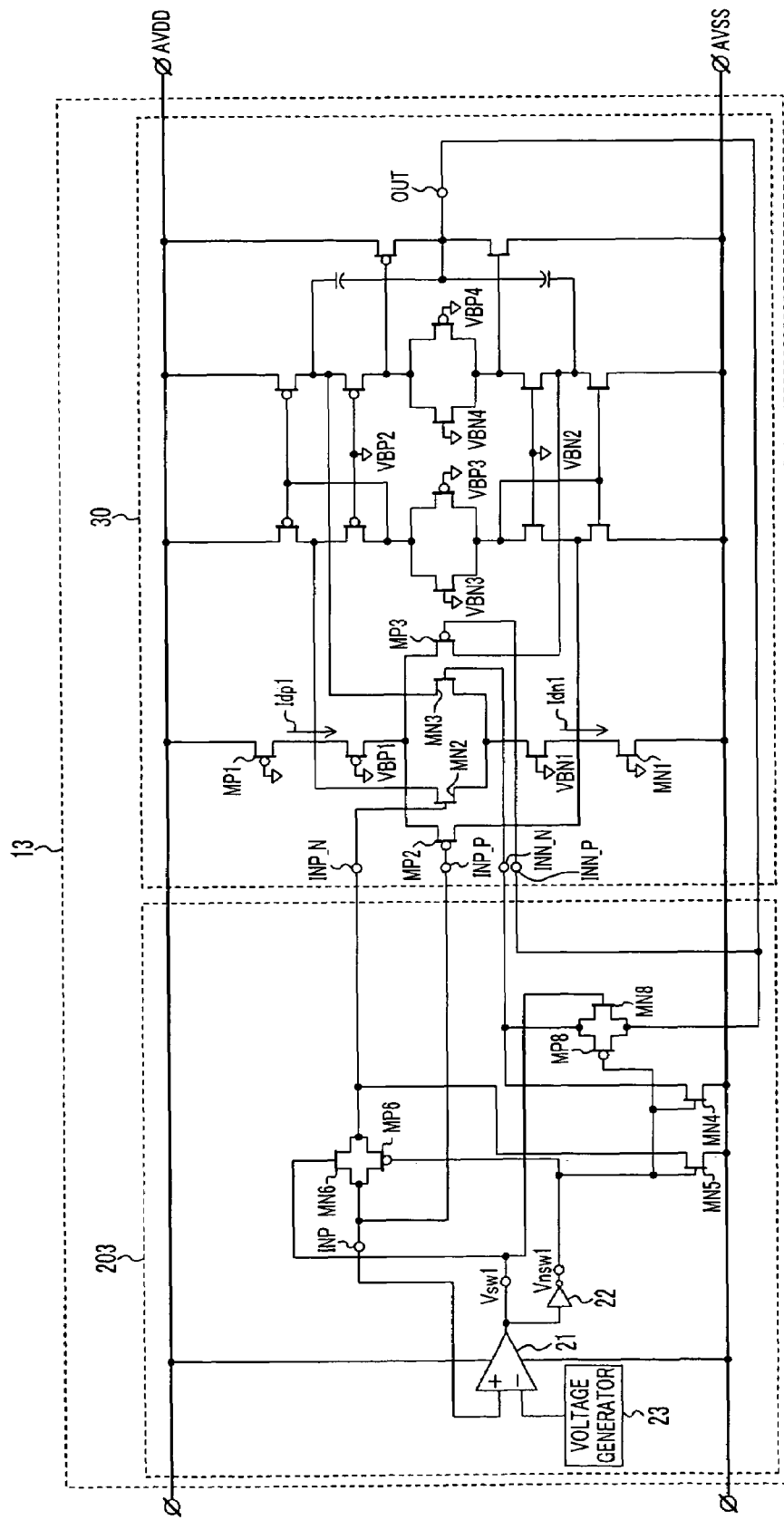
FIG. 4 is a circuit diagram of an offset fixing operational amplifier circuit according to Embodiment 4 of the invention.

FIG. 4 is a circuit diagram of an offset fixing operational amplifier circuit according to Embodiment 4 of the invention. The offset fixing operational amplifier circuit 13 of this embodiment includes an offset fixing circuit 203 and a conventional operational amplifier circuit 30. A significant difference between the offset fixing operational amplifier circuit 13 of this embodiment and the offset fixing operational amplifier circuit 11 of FIG. 2 is that an offset value is changed in accordance with an output voltage Va of a voltage generator 23 by controlling a gate voltage of an NMOS differential pair alone.

Now, the operation of the offset fixing operational amplifier circuit 13 will be described with reference to FIGS. 14A through 14H. It is assumed in the description below that the voltage generator 23 output an output voltage Va. Also, it is assumed that the voltage comparator circuit 21 outputs a voltage AVDD when an input voltage INP is larger than the output voltage Va and outputs a voltage AVSS when the input voltage INP is smaller than the output voltage Va.

A waveform of FIG. 14A is obtained when the input voltage INP of the operational amplifier circuit 30 is changed from a potential resulting from addition of an overdrive voltage to the voltage AVSS to a potential resulting from subtraction of the overdrive voltage from the voltage AVDD. In a period when the input voltage INP is smaller than the output voltage Va, a signal Vsw1 corresponds to the voltage AVSS, and in a period when the input voltage INP is larger than the output voltage Va, the signal Vsw1 corresponds to the voltage AVDD (see FIG. 14B). In the period when the input voltage INP is smaller than the output voltage Va, a signal Vnsw1 corresponds to the voltage AVDD, and in the period when the input voltage INP is larger than the output voltage Va, the signal Vnsw1 corresponds to the voltage AVSS (see FIG. 14C). In a period when the input voltage INP is larger than a voltage Vt2, differential pair transistors MP2 and MP3 are in an off state due to the transistor characteristic and hence a constant current Idp1 does not pass through the differential pair, and in a period when the input voltage INP is smaller than the voltage Vt2, the differential pair transistors MP2 and MP3 are in an on state and hence the current Idp1 passes through the differential pair (see FIGS. 14D and 14E). In the period when the input voltage INP is smaller than the output voltage Va, differential pair transistors MN2 and MN3 are in an off state and hence a current Idn1 does not pass through the differential pair, and in the period when the input voltage INP is larger than the output voltage Va, the differential pair transistors MN2 and MN3 are in an on state and hence the current Idn1 passes through the differential pair (see FIGS. 14F and 14G). As a result, in the offset fixing operational amplifier circuit 13 of this embodiment, a constant offset characteristic is attained in the period when the input voltage INP is smaller than the output voltage Va (see FIG. 14H).

Embodiment 5

Figure 5:
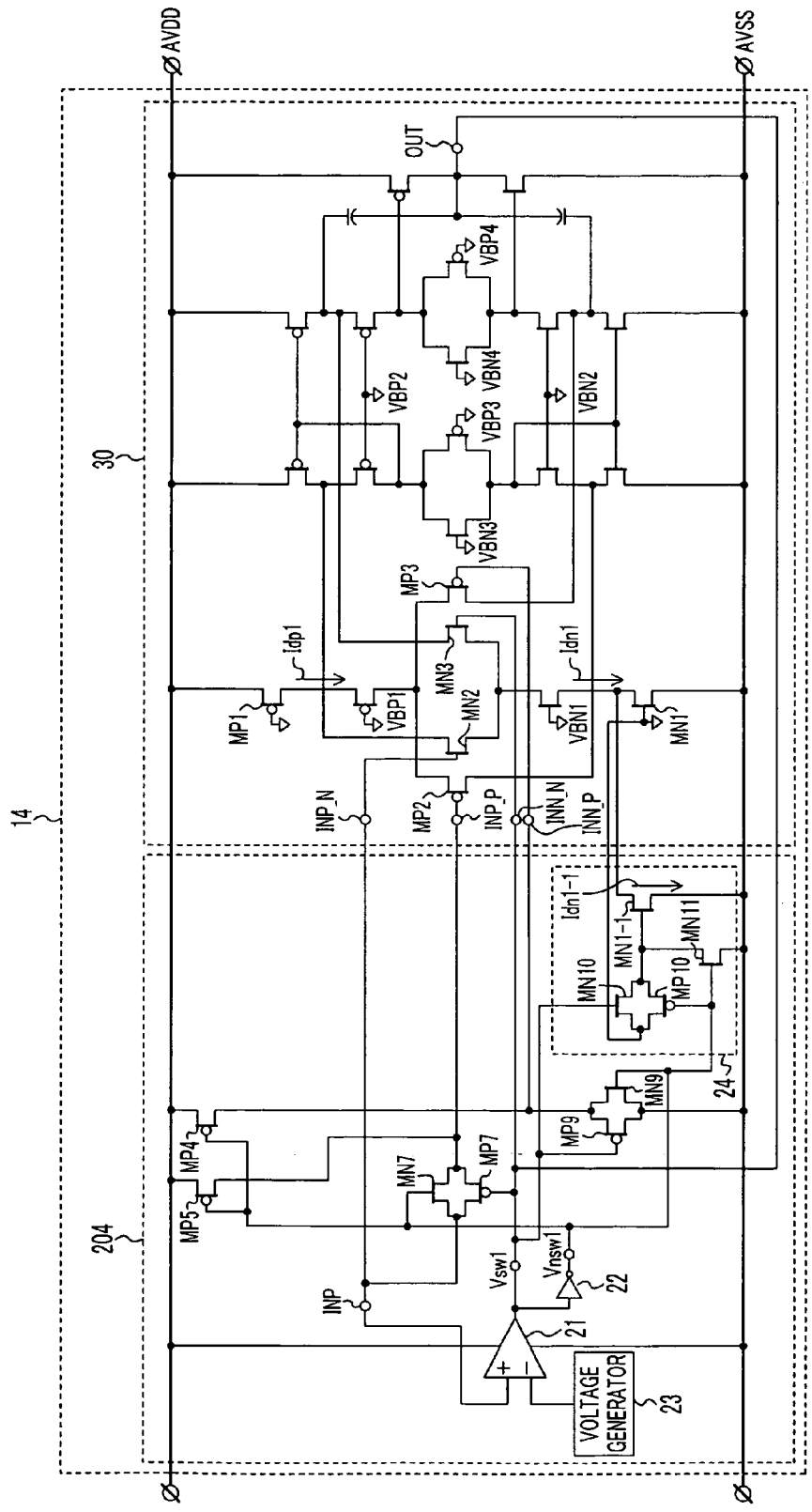
FIG. 5 is a circuit diagram of an offset fixing operational amplifier circuit according to Embodiment 5 of the invention.

FIG. 5 is a circuit diagram of an offset fixing operational amplifier circuit according to Embodiment 5 of the invention. The offset fixing operational amplifier circuit 14 of this embodiment includes an offset fixing circuit 204 and a conventional operational amplifier circuit 30. The offset fixing circuit 204 is obtained by further providing a current regulator circuit 24 in the offset fixing circuit 202 of FIG. 3. The current regulator circuit 24 includes an NMOS transistor MN1-1 having a drain connected to the drain of a transistor MN1 and a source connected to a voltage AVSS; and switches MN10, MP10 and MN11 for switching supply of the same bias voltage as that supplied to the transistor MN1 or the voltage AVSS to the gate of the transistor MN1-1 with signals Vsw1 and Vnsw1 used as control signals.

Now, the operation of the offset fixing operational amplifier circuit 14 will be described with reference to FIGS. 15A through 15H. It is assumed in the description below that a voltage generator 23 output an output voltage Va. Also, it is assumed that a voltage comparator circuit 21 outputs a voltage AVDD when an input voltage INP is larger than the output voltage Va and outputs the voltage AVSS when the input voltage INP is smaller than the output voltage Va.

A waveform of FIG. 15A is obtained when the input voltage INP of the operational amplifier circuit 30 is changed from a potential resulting from addition of an overdrive voltage to the voltage AVSS to a potential resulting from subtraction of the overdrive voltage from the voltage AVDD. In a period when the input voltage INP is smaller than the output voltage Va, the signal Vsw1 corresponds to the voltage AVSS, and in a period when the input voltage INP is larger than the output voltage Va, the signal Vsw1 corresponds to the voltage AVDD (see FIG. 15B). In the period when the input voltage INP is smaller than the output voltage Va, the signal Vnsw1 corresponds to the voltage AVDD, and in the period when the input voltage INP is larger than the output voltage Va, the signal Vnsw1 corresponds to the voltage AVSS (see FIG. 15C). In the period when the input voltage INP is smaller than the output voltage Va, differential pair transistors MP2 and MP3 are in an on state and hence a constant current Idp1 passes through the differential pair, and in the period when the input voltage INP is larger than the output voltage Va, the differential pair transistors MP2 and MP3 are in an off state and hence the current Idp1 does not pass through the differential pair (see FIGS. 15D and 15E). In a period when the input voltage INP is smaller than a voltage Vt1, differential pair transistors MN2 and MN3 are in an off state due to the transistor characteristic and hence a current Idn1 does not pass through the differential pair, and in a period when the input voltage INP is larger than the voltage Vt1, the differential pair transistors MN2 and MN3 are in an on state and hence a current corresponding to a sum of the current Idn1 and a current Idn1-1 passing through the transistor MN1-1 passes through the differential pair (see FIGS. 15F and 15G). As a result, in the offset fixing operational amplifier circuit 14 of this embodiment, a constant offset characteristic is attained in the period when the input voltage INP is larger than the output voltage Va and the offset value is made smaller (see FIG. 15H).

Furthermore, a circuit similar to the current regulator circuit 24 may be additionally provided in the offset fixing circuit 201 of FIG. 2 or the offset fixing circuit 203 of FIG. 4. An offset fixing operational amplifier circuit thus obtained also exhibits the aforementioned effects.

Embodiment 6

Figure 6:
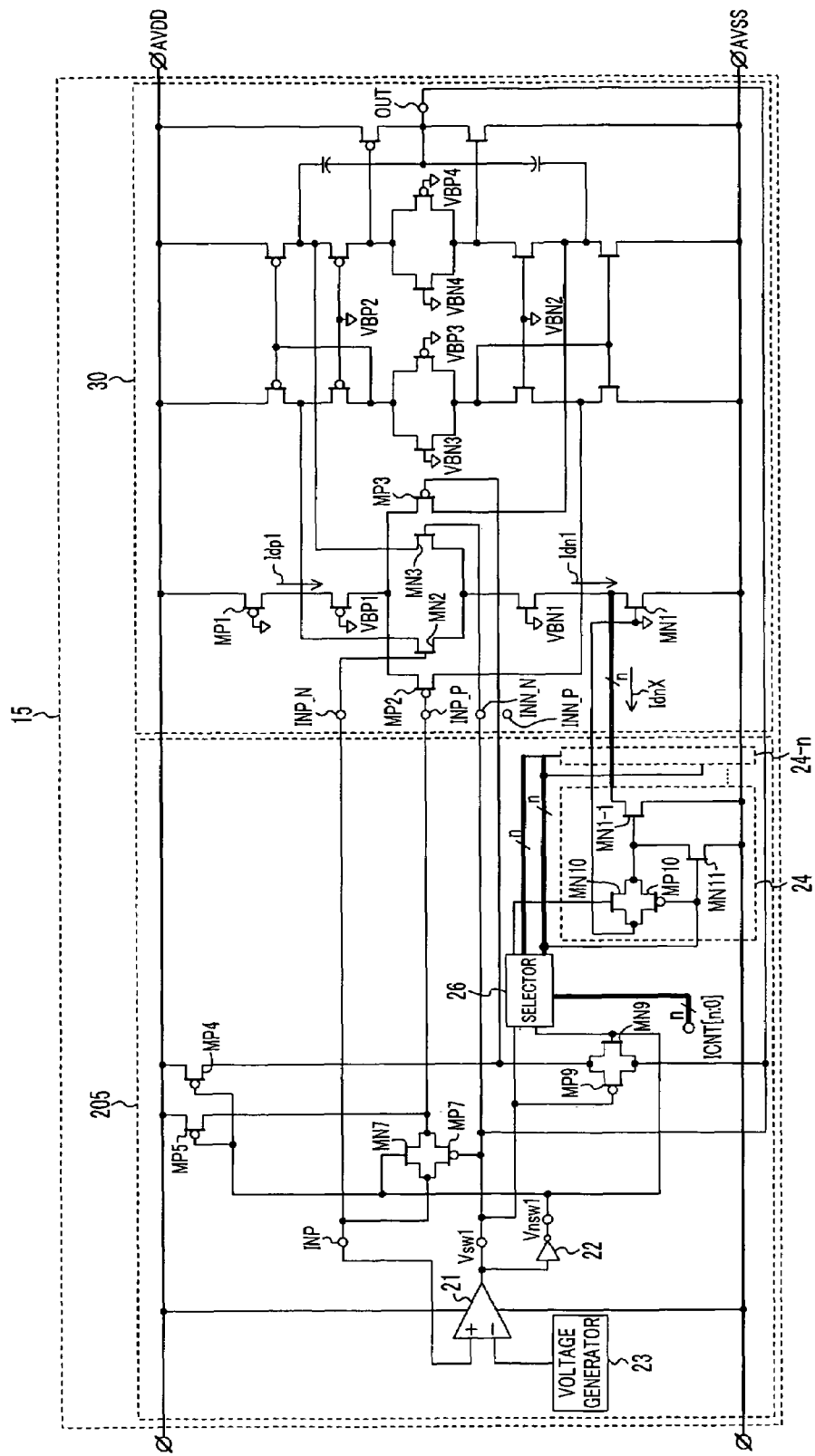
FIG. 6 is a circuit diagram of an offset fixing operational amplifier circuit according to Embodiment 6 of the invention.

FIG. 6 is a circuit diagram of an offset fixing operational amplifier circuit according to Embodiment 6 of the invention. The offset fixing operational amplifier circuit 15 of this embodiment includes an offset fixing circuit 205 and a conventional operational amplifier circuit 30. The offset fixing circuit 205 is obtained by further providing, in the offset fixing circuit 202 of FIG. 3, n current regulator circuits 24 and a selector 26 for arbitrarily selecting one of these current regulator circuits 24 in accordance with a control signal ICNT [n:0].

Now, the operation of the offset fixing operational amplifier circuit 15 will be described with reference to FIGS. 16A through 16H. It is assumed in the description below that a voltage generator 23 output an output voltage Va. Also, it is assumed that a voltage comparator circuit 21 outputs a voltage AVDD when an input voltage INP is larger than the output voltage Va and outputs a voltage AVSS when the input voltage INP is smaller than the output voltage Va.

A waveform of FIG. 16A is obtained when the input voltage INP of the operational amplifier circuit 30 is changed from a potential resulting from addition of an overdrive voltage to the voltage AVSS to a potential resulting from subtraction of the overdrive voltage from the voltage AVDD. In a period when the input voltage INP is smaller than the output voltage Va, a signal Vsw1 corresponds to the voltage AVSS, and in a period when the input voltage INP is larger than the output voltage Va, the signal Vsw1 corresponds to the voltage AVDD (see FIG. 16B). In the period when the input voltage INP is smaller than the output voltage Va, a signal Vnsw1 corresponds to the voltage AVDD, and in the period when the input voltage INP is larger than the output voltage Va, the signal Vnsw1 corresponds to the voltage AVSS (see FIG. 16C). In the period when the input voltage INP is smaller than the output voltage Va, differential pair transistors MP2 and MP3 are in an on state and hence a constant current Idp1 passes through the differential pair, and in the period when the input voltage INP is larger than the output voltage Va, the differential pair transistors MP2 and MP3 are in an off state and hence the current Idp1 does not pass through the differential pair (see FIGS. 16D and 16E). In a period when the input voltage INP is smaller than a voltage Vt1, differential pair transistors MN2 and MN3 are in an off state due to the transistor characteristic and hence a current Idn1 does not pass through the differential pair, and in a period when the input voltage INP is larger than the voltage Vt1, the differential pair transistors MN2 and MN3 are in an on state and hence the current Idn1 passes through the differential pair. Furthermore, in the period when the input voltage INP is larger than the output voltage Va, a transistor MN1-1 is also in an on state and hence a current obtained as a sum of the current Idn1 and a total current Idn1$x$ passing through the current regulator circuits 24 passes through the differential pair (see FIGS. 16F and 16G). As a result, in the offset fixing operational amplifier circuit 15 of this embodiment, a constant offset characteristic is attained in the period when the input voltage INP is larger than the output voltage Va and the offset value is made arbitrarily smaller (see FIG. 16H).

Furthermore, a circuit similar to a combination of the n current regulator circuits 24 and the selector 26 may be additionally provided in the offset fixing circuit 201 of FIG. 2 or the offset fixing circuit 203 of FIG. 4. An offset fixing operational amplifier circuit thus obtained also exhibits the aforementioned effects.

Embodiment 7

Figure 7:
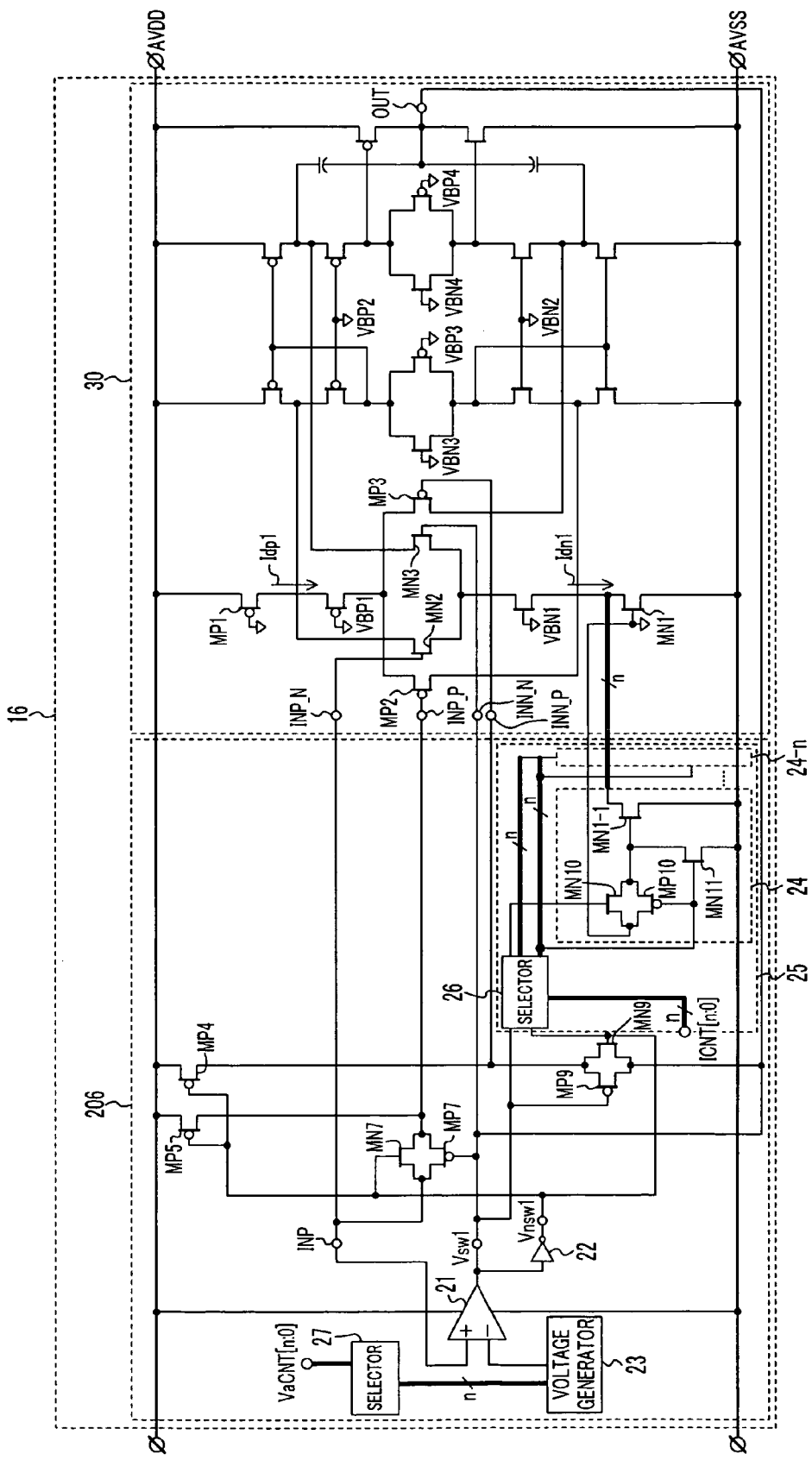
FIG. 7 is a circuit diagram of an offset fixing operational amplifier circuit according to Embodiment 7 of the invention.

FIG. 7 is a circuit diagram of an offset fixing operational amplifier circuit according to Embodiment 7 of the invention. The offset fixing operational amplifier circuit 16 of this embodiment includes an offset fixing circuit 206 and a conventional operational amplifier circuit 30. The offset fixing circuit 205 is obtained by additionally providing, in the offset fixing circuit 205 of FIG. 6, a selector 27 for arbitrarily selecting an output voltage Va of a voltage generator 23 in accordance with a control signal VaCNT[n:0].

Now, the operation of the offset fixing operational amplifier circuit 16 will be described with reference to FIGS. 17A through 17H. It is assumed in the description below that the voltage generator 23 output an output voltage Va. Also, it is assumed that a voltage comparator circuit 21 outputs a voltage AVDD when an input voltage INP is larger than the output voltage Va and outputs a voltage AVSS when the input voltage INP is smaller than the output voltage Va.

A waveform of FIG. 17A is obtained when the input voltage INP of the operational amplifier circuit 30 is changed from a potential resulting from addition of an overdrive voltage to the voltage AVSS to a potential resulting from subtraction of the overdrive voltage from the voltage AVDD. In a period when the input voltage INP is smaller than the output voltage Va, a signal Vsw1 corresponds to the voltage AVSS, and in a period when the input voltage INP is larger than the output voltage Va, the signal Vsw1 corresponds to the voltage AVDD (see FIG. 17B). In the period when the input voltage INP is smaller than the output voltage Va, a signal Vnsw1 corresponds to the voltage AVDD, and in the period when the input voltage INP is larger than the output voltage Va, the signal Vnsw1 corresponds to the voltage AVSS (see FIG. 17C). In the period when the input voltage INP is smaller than the output voltage Va, differential pair transistors MP2 and MP3 are in an on state and hence a constant current Idp1 passes through the differential pair, and in the period when the input voltage INP is larger than the output voltage Va, the differential pair transistors MP2 and MP3 are in an off state and hence the current Idp1 does not pass through the differential pair (see FIGS. 17D and 17E). In a period when the input voltage INP is smaller than a voltage Vt1, differential pair transistors MN2 and MN3 are in an off state due to the transistor characteristic and hence a current Idn1 does not pass through the differential pair, and in a period when the input voltage INP is larger than the voltage Vt1, the differential pair transistors MN2 and MN3 are in an on state and hence the current Idn1 passes through the differential pair. Furthermore, in the period when the input voltage INP is larger than the output voltage Va, a transistor MN1-1 is also in an on state and hence a current obtained as a sum of the current Idn1 and a total current Idn1$x$ passing through the current regulator circuits 24 passes through the differential pair (see FIGS. 17F and 17G). As a result, in the offset fixing operational amplifier circuit 16 of this embodiment, a constant offset characteristic is attained in the period when the input voltage INP is larger than the output voltage Va and the offset value is arbitrarily made smaller. Furthermore, the output voltage Va is set to an arbitrary voltage in accordance with the control signal VaCNT[n:0].

Embodiment 8

Figure 8:
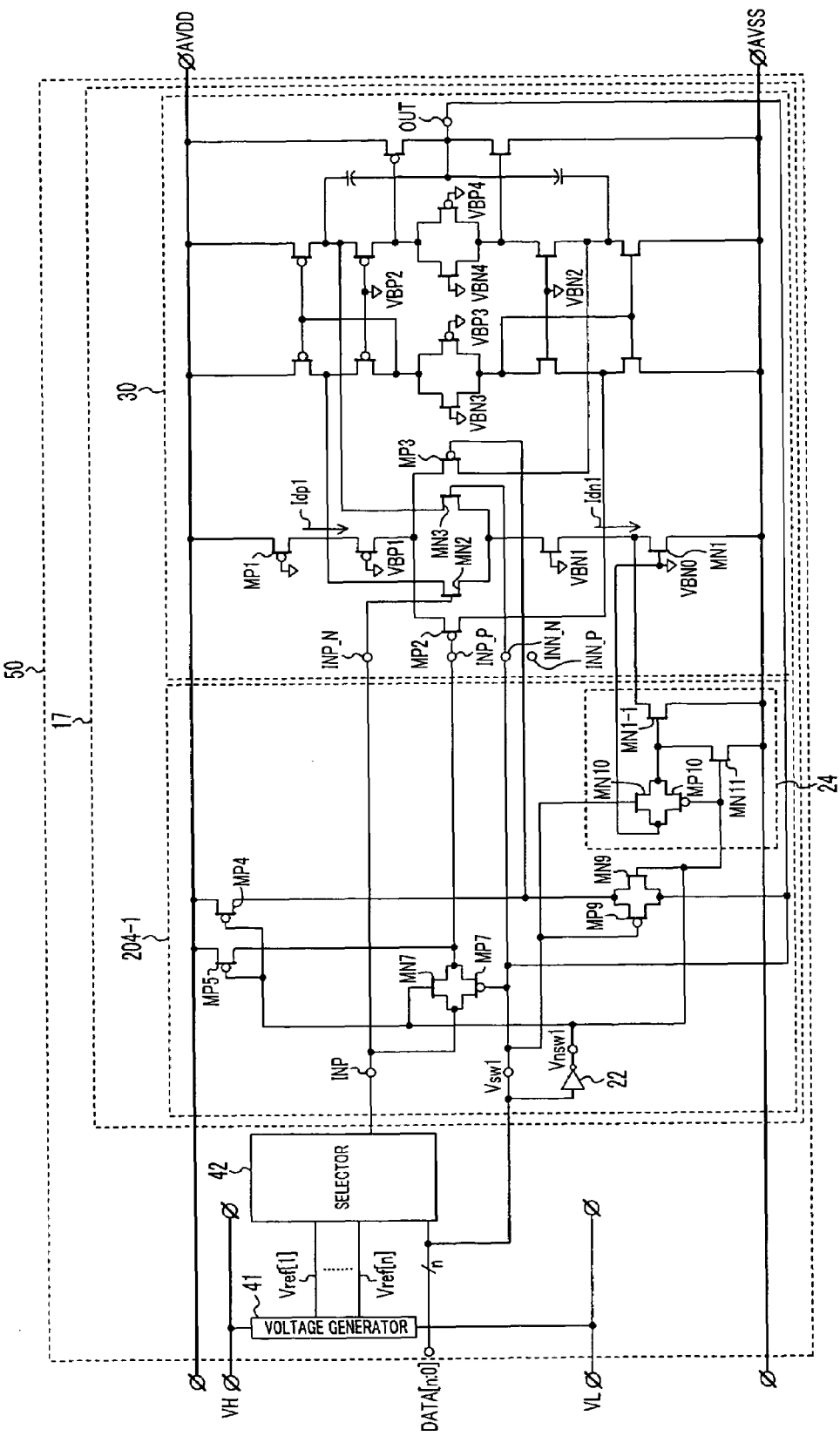
FIG. 8 is a circuit diagram of a D/A converter according to Embodiment 8 of the invention.

FIG. 8 is a circuit diagram of a D/A converter according to Embodiment 8 of the invention. The D/A converter 50 of this embodiment includes an offset fixing operational amplifier circuit 17; a voltage generator 41 for generating a plurality of voltages Vref[n:1] on the basis of voltages VH and VL; and a selector 42 for selecting one of the plural voltages Vref[n:1] and supplying the selected voltage to the offset fixing operational amplifier 17 as an input voltage INP. The offset fixing operational amplifier circuit 17 includes an offset fixing circuit 204-1 obtained by eliminating the voltage generator 23 and the voltage comparator circuit 21 from the offset fixing circuit 204 of FIG. 5 and a conventional operational amplifier circuit 30.

The selector 42 supplies an analog voltage output as the input voltage INP of the operational amplifier circuit 30 in accordance with received data signals DATA[n:0]. Also, since one of data signals DATA[n:0] is used as a signal Vsw1 for the offset fixing circuit 204-1, the voltage generator 23 and the voltage comparator circuit 21 are eliminated for reducing the circuit area.

Embodiment 9

Figure 9:
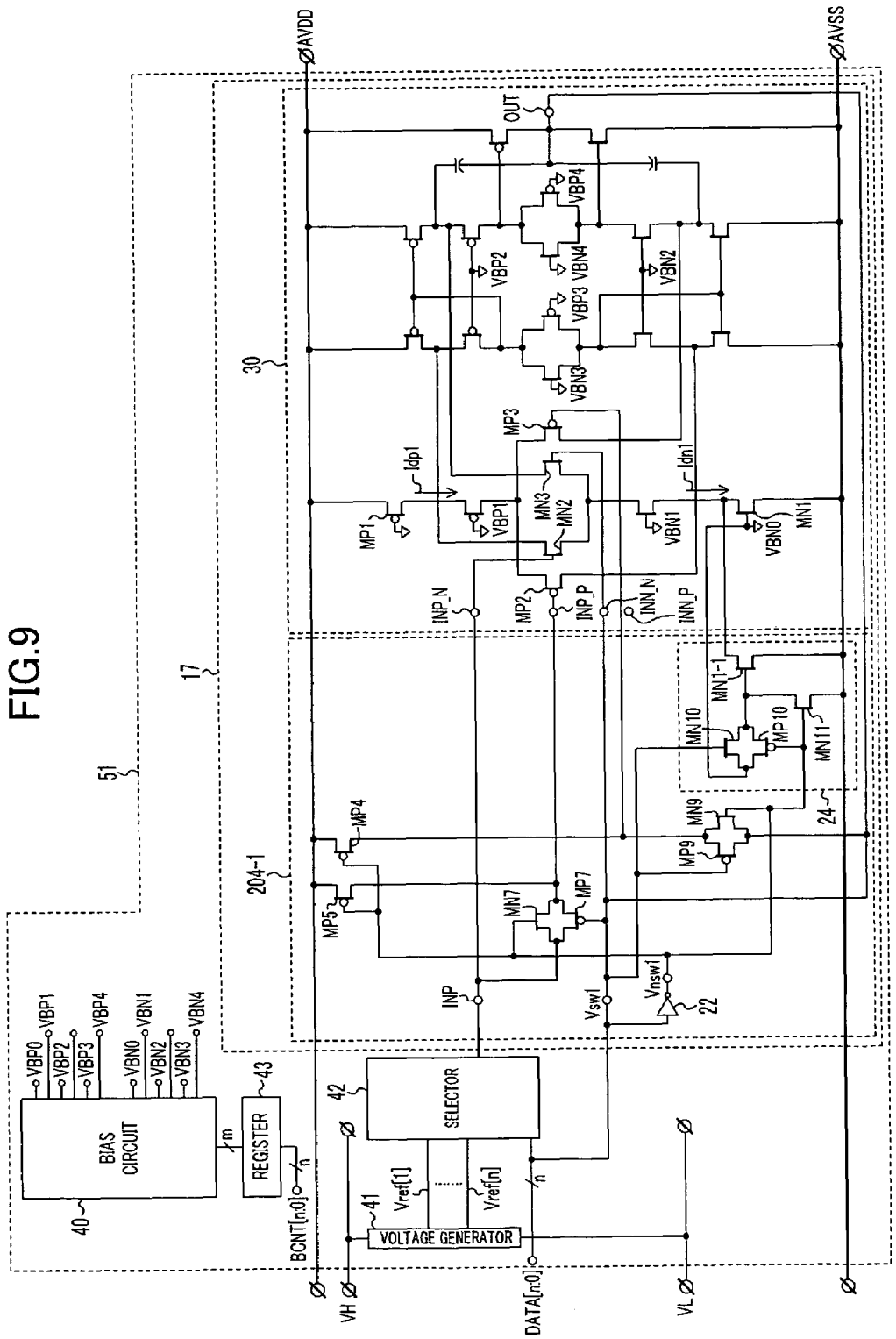
FIG. 9 is a circuit diagram of a D/A converter according to Embodiment 9 of the invention.

FIG. 9 is a circuit diagram of a D/A converter according to Embodiment 9 of the invention. The D/A converter 51 of this embodiment is obtained by additionally providing a register 43 in the D/A converter 50 of FIG. 8. The register 43 controls a bias voltage generated by a bias circuit 40 to be supplied to the operational amplifier circuit 30 in accordance with a control signal BCNT[n:0].

According to this embodiment, the offset is controlled by the offset fixing circuit 204-1, and when analog characteristic degradation apart from the offset of the operational amplifier circuit 30 is caused, the bias voltage is controlled by changing the control signal BCNT[n:0]. Thus, all the characteristics of the operational amplifier circuit 30 are controlled.

What is claimed is:
1. An offset fixing operational amplifier circuit comprising:
an operational amplifier circuit including an input stage containing a first constant current source, a second constant current source, a first differential pair and a second differential pair;

a bias circuit for supplying a bias voltage to the operational amplifier circuit; and an offset fixing circuit for controlling the input stage in accordance with an input voltage of the operational amplifier circuit;

wherein the offset fixing circuit includes:

a first switch for turning on/off the first constant current source;

a second switch for turning on/off the second constant current source;

a voltage generator for determining transition timing of a control signal used for controlling the first switch and the second switch; and a voltage comparator for generating the control signal on the basis of an input voltage of a noninverted input terminal of the operational amplifier circuit and an output voltage of the voltage generator.

2. An offset fixing operational amplifier circuit comprising:

an operational amplifier circuit including an input stage containing a first constant current source, a second constant current source, a first differential pair and a second differential pair;

a bias circuit for supplying a bias voltage to the operational amplifier circuit; and an offset fixing circuit for controlling the input stage in accordance with an input voltage of the operational amplifier circuit;

wherein the offset fixing circuit includes:

a first switch for turning on/off a noninverted input of the first differential pair;

a second switch for turning on/off an inverted input of the first differential pair;

a third switch for tuning on/off a noninverted input of the second differential pair;

a fourth switch for turning on/off an inverted input of the second differential pair;

a voltage generator for determining transition timing of a control signal used for controlling the first, second, third and fourth switches; and a voltage comparator for generating the control signal on the basis of an input voltage of a noninverted input terminal of the operational amplifier circuit and an output voltage of the voltage generator.

3. The offset fixing operational amplifier circuit of claim 2, wherein the offset fixing circuit further includes:

a third constant current source connected in parallel to the first constant current source;

a fifth switch for turning on/off the third constant current source;

a fourth constant current source connected in parallel to the second constant current source; and a sixth switch for turning on/off the fourth constant current source, and the control signal is used for controlling the first, second, third, fourth, fifth and sixth switches.

4. The offset fixing operational amplifier circuit of claim 3, wherein the offset fixing circuit further includes:

a first current regulator circuit capable of arbitrarily regulating a current value of the third constant current source; and a second current regulator circuit capable of arbitrarily regulating a current value of the fourth constant current source.

5. The offset fixing operational amplifier circuit of claim 1, wherein the offset fixing circuit further includes a voltage regulator circuit capable of arbitrarily regulating the output voltage of the voltage generator.

6. The offset fixing operational amplifier circuit of claim 2, wherein the offset fixing circuit further includes a voltage regulator circuit capable of arbitrarily regulating the output voltage of the voltage generator.

7. The offset fixing operational amplifier circuit of claim 1 further comprising, a bias voltage regulator circuit capable of arbitrarily regulating the bias voltage.

8. A D/A converter comprising:

an offset fixing operational amplifier comprising:

an operational amplifier circuit including an input stage containing a first constant current source, a second constant current source, a first differential pair and a second differential pair;

a bias circuit for supplying a bias voltage to the operational amplifier circuit; and an offset fixing circuit for controlling the input stage in accordance with an input voltage of the operational amplifier circuit;

a voltage generator for generating a plurality of voltages; and a selector for selecting one of the plurality of voltages in accordance with a data signal of a plurality of bits input thereto and inputting the selected voltage to the operational amplifier circuit, the offset fixing circuit including:

a first switch for tuning on/off the first constant current source; and a second switch for turning on/off the second constant current source, the first switch and the second switch being controlled in accordance with the data signal.

9. A D/A converter comprising:

an offset fixing operational amplifier comprising:

an operational amplifier circuit including an input stage containing a first constant current source, a second constant current source, a first differential pair and a second differential pair;

a bias circuit for supplying a bias voltage to the operational amplifier circuit; and an offset fixing circuit for controlling the input stage in accordance with an input voltage of the operational amplifier circuit;

a voltage generator for generating a plurality of voltages; and a selector for selecting one of the plurality of voltages in accordance with a data signal of a plurality of bits input thereto and inputting the selected voltage to the operational amplifier circuit, the offset fixing circuit including:

a first switch for tuning on/off an inverted input of the second differential pair; and a second switch for turning on/off a noninverted input of the second differential pair, the first switch and the second switch being controlled in accordance with the data signal.

* * * * *